United States Patent [19]

Suzuki

[11] Patent Number: 5,986,482
[45] Date of Patent: Nov. 16, 1999

[54] INPUT CIRCUIT OF COUNTER CIRCUIT, AND INTEGRATED CIRCUIT FOR FREQUENCY SYNTHESIZER USING THE SAME

[75] Inventor: Tamotsu Suzuki, Kyoto, Japan

[73] Assignee: Rohm Co. Ltd., Kyoto, Japan

[21] Appl. No.: 08/923,334

[22] Filed: Sep. 4, 1997

[30] Foreign Application Priority Data

Sep. 10, 1996 [JP] Japan ................................. 8-238838

[51] Int. Cl.$^6$ ................................................ H03K 17/00
[52] U.S. Cl. ........................ 327/99; 327/403; 327/405; 327/44
[58] Field of Search ................... 364/724.08; 327/333, 327/40, 46, 47, 105, 107, 44, 90, 99, 403, 404, 405, 415, 417, 416; 455/142, 143; 375/319

[56] References Cited

U.S. PATENT DOCUMENTS

| | | | |
|---|---|---|---|
| 4,333,150 | 6/1982 | Matty | 364/484 |
| 5,751,178 | 5/1998 | Shor | 327/333 |
| 5,838,735 | 11/1998 | Khullar | 375/319 |
| 5,857,003 | 1/1999 | Geiger | 375/319 |

*Primary Examiner*—Toan Tran
*Assistant Examiner*—Anh-Quan Tra
*Attorney, Agent, or Firm*—Nikaido Marmelstein Murray & Oram LLP

[57] ABSTRACT

A first amplifier circuit having a high frequency characteristic and a second amplifier circuit having a low frequency characteristic have first and second input terminals, respectively. The first and second amplifier circuits have first and second feedback resistors for self-bias and first and second switching elements capable of interrupting outputs of the amplifier circuits, respectively. Between the first and second input terminals, a third switching element is connected. A device for controlling on and off of the switching elements is provided in order that according to a signal input to the first and second input terminals, the signal is transmitted to either the first amplifier circuit or the second amplifier circuit. As a result, irrespective of whether the front end has one output terminal or two output terminals, the input circuit can be connected to the PLL synthesizer IC as it is by connecting the output to the first input terminal or to the two input terminals.

8 Claims, 5 Drawing Sheets

INPUT CIRCUIT OF COUNTER CIRCUIT, AND INTEGRATED CIRCUIT FOR FREQUENCY SYNTHESIZER USING THE SAME

BACKGROUND OF THE INVENTION

The present invention relates to an input circuit of a counter circuit used in a frequency synthesizer IC (integrated circuit). More specifically, the present invention relates to an input circuit of a counter circuit and to an integrated circuit for a frequency synthesizer using the same. The input circuit is capable of being connected as it is in both 1) where signals of two frequency bands which are away from each other such as the AM (amplitude-modulated) band and the FM (frequency-modulated) band are output from one output terminal and b) where the signals are separately output from two output terminals.

BACKGROUND OF THE INVENTION

Recently, most of the audio tuner sections of radio receivers, etc. have been constituted by digital synthesizers in which ICs for digital synthesizer tuners having PLL (phase-locked loop) circuits are used. To form the digital synthesizer tuner, first, at the front end, an intermediate-frequency signal is produced by using a VCO (voltage-controlled oscillator) serving as a local oscillator and a signal received by an antenna. For example, in a radio receiver, when both AM and FM broadcast bands are received, the local oscillator is used for both the AM and FM bands and an intermediate-frequency signal is produced for each of the AM and FM bands. The output of the VCO, serving as the local oscillator, is used by a counter circuit of the IC.

When the signals are amplified by the PLL circuit, since the AM and FM bands, for example, are away from each other and the frequency characteristic of an amplifier circuit in which a MOSFET (metal-oxide-semiconductor field-effect transistor) is used is different between the AM and FM bands, different amplifier circuits are normally used for the high-frequency band and for the low-frequency band. As for the output of the front end, there are two cases according to the structure where signals of the AM and FM bands of the VCO are output from one output terminal and where signals of the AM and FM bands are separately output from two output terminals. Therefore, for a front end having two output terminals in the VCO, an IC for a PLL synthesizer is used which has two input terminals for the two output terminals, respectively. For a front end having one output terminal, an IC is used which has one input terminal and logically switches the frequency characteristic in the PLL circuit according to whether a high-frequency signal or a low-frequency signal is input. Examples of these arrangements are shown in FIGS. 4(a) to 4(b).

In FIG. 4(a), as the output of a front end 11, output terminals 12 and 13 are provided for the FM and AM bands, respectively. As a PLL circuit 21, an IC is used which has input terminals 22 and 23 in correspondence with the terminals 12 and 13. Although only the terminals of the VCO are shown and the terminals for intermediate frequencies are not shown in the figure, for the intermediate frequencies, different terminals are used because there is a difference between the intermediate frequencies of the FM and AM bands which are 10.7 MHz and 450 kHz. In FIG. 4(a), reference numeral 14 represents a receiving antenna and reference numerals 15 and 16 represent coupling capacitors.

In FIG. 4(b), as the output of the front end 11, one output terminal 17 is provided which is common to the AM and FM bands. In the front end 11, a switch 18 is provided for switching between the outputs of the AM and FM bands so that one of the outputs is output. Accordingly, as the PLL circuit, an IC is used which has one input terminal 24 and the frequency characteristic is logically switched in the PLL circuit 21 as described above. Examples of the switching are described, for example, in Japanese Utility Model Publications Nos. H4-38606 and H4-45305. Reference numeral 19 represents a coupling capacitor.

As described above, there are cases where the front end has one output terminal and where the front end has two output terminals and it is therefore necessary to use a different frequency synthesizer IC having a PLL circuit for each of the cases.

To reduce to one the output terminals of the front end having two output terminals, as shown in FIG. 5(a), a resistor R11 and a capacitor C11, and a resistor R12 and a capacitor C12 are connected to the output terminals, respectively, and coupled to realize one output terminal 17. Conversely, to increase to two the output terminal of the front end having one output terminal 17, as shown in FIG. 5(b), resistors R13 and R14 and capacitors C13 and C14 are connected to realize two output terminals 12 and 13. However, increasing or decreasing the number of output terminals connected to the PLL circuit 21 by connecting the filter circuit comprising resistors and capacitors causes the following problems: (1) that the output level of the front end attenuates; (2) that signals leak into the sides of the other bands to cause interference; and (3) that the number of external elements increases because it is necessary to externally connect the resistors and capacitors.

SUMMARY OF THE INVENTION

An object of the present invention is to provide an input circuit of a counter circuit in a PLL synthesizer IC capable of handling both of the cases where the front end has one output terminal and where the front end has two output terminals, or the like.

Another object of the present invention is to provide an integrated circuit for a PLL frequency synthesizer having the above-mentioned input circuit in the input section of the PLL circuit.

An input circuit of a counter circuit according to the present invention comprises: first and second input terminals; first and second amplifier circuits connected to the first and second input terminals, respectively, the second amplifier circuit having a lower frequency characteristic than the first amplifier circuit; first and second feedback resistors for self-bias incorporated in the first and second amplifier circuits, respectively; first and second switching elements incorporated in the first and second amplifier circuits, respectively, or externally connected, the first and second switching elements being capable of interrupting feedback outputs of the amplifier circuits; and a third switching element connected between the first and second input terminals, and means for controlling on and off of the switching elements is provided in order that according to a signal input to the first and second input terminals, the signal is transmitted to either the first amplifier circuit or the second amplifier circuit.

According to this feature, when the front end has one output terminal, by connecting the output terminal to the first input terminal, an AM or FM signal is automatically transmitted to an appropriate amplifier circuit and when the front end has two output terminals, the signals are received by connecting the output terminals to the first and second input terminals, respectively.

Preferably, in a case where a plurality of signals having different frequencies are all input to the first input terminal, the controlling means is set so that when the third switching element is off, the first switching element is on and the second switching element is off and when the third switching element is on, the first switching element is off and the second switching element is on, and in a case where signals are separately input to the first and second input terminals, the controlling means is set so that when a signal input to the first input terminal is processed, the second switching element is off and the first switching element is on and when a signal input to the second input terminal is processed, the first switching element is off and the second switching element is on. According to this feature, in both of the case of the front end in which AM and FM signals, for example, are output from one output terminal and the case of the front end in which the signals are separately output from two output terminals, only by controlling on and off of the first to third switching elements, the FM and AM signals are separately transmitted, for example, to the first and second amplifier circuits, respectively, so that the signals are amplified and counted on their respective frequency-band sides without attenuation or interference.

Preferably, the first and/or second switching elements are used also as the first and/or second feedback resistors by using resistors of the first and/or second switching elements. This is preferable because the circuit scale is reduced.

Preferably, fourth and/or fifth switching elements are connected between the first and/or second input terminals and ground, and means, for turning on the fourth and fifth switching elements when no signal is input to the input terminals and the amplifier circuits to which the switching elements are connected, is provided in said controlling means. This is preferable because the line on the side of the unused frequency band is brought to a completely unused state by pulling it down at the input terminal section to thereby prevent noise and interference.

An integrated circuit for a frequency synthesizer according to the present invention comprises: (a) the above-described input circuit; (b) a counter circuit for frequency-dividing a high-frequency signal or a low-frequency signal output from said input circuit; and (c) a phase comparator for comparing a wavelength or a phase of an output of said counter circuit with that of a reference signal.

DETAILED DESCRIPTION

Figure 1:
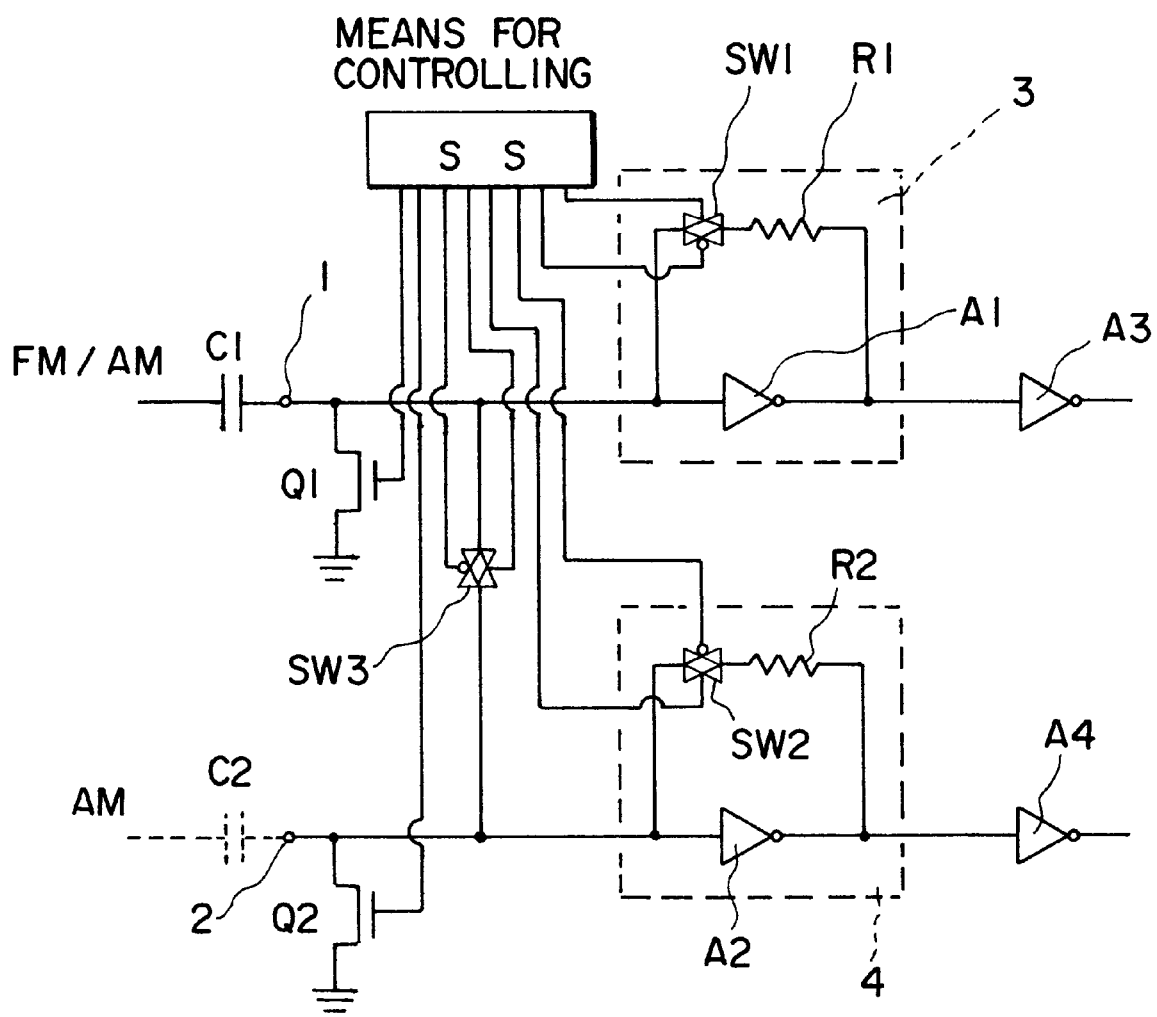
FIG. 1 is an explanatory view showing an embodiment of an input circuit of a counter circuit according to the present invention.

As shown in FIG. 1, an input circuit of a counter circuit according to the present invention is provided. A first amplifier circuit 3 having a high frequency characteristic and a second amplifier circuit 4 having a low frequency characteristic have first and second input terminals 1 and 2, respectively. The first and second amplifier circuits 3 and 4 have first and second feedback resistors R1 and R2 for self-bias and first and second switching elements SW1 and SW2 capable of interrupting feedback outputs of the amplifier circuits 3 and 4, respectively. Between the first and second input terminals 1 and 2, a third switching element SW3 is connected for switching between the first and second amplifier circuits 3 and 4 according to the frequency band of the signal input to the first input terminal 1. Moreover, means for controlling on and off of the switching elements SW1 to SW3 is provided in order that according to a signal input to the first and second input terminals 1 and 2, the signal is transmitted to either the first amplifier circuit 3 or the second amplifier circuit 4.

In FIG. 1, reference designations Q1 and Q2 represent transistors connected between the first and second input terminals 1 and 2 and ground. The transistors Q1 and Q2 act as switching elements (fourth and fifth switching elements), that is, when on, the transistors Q1 and Q2 act as pull-down resistors which connect the input terminals 1 and 2 to ground, and when off, which make the input terminals 1 and 2 usable. Reference designations A3 and A4 represent inverter circuits. Reference designations C1 and C2 represent coupling capacitors.

In the example shown in FIG. 1, the first amplifier circuit 3 has a high frequency characteristic and comprises an amplifier A1 for high-frequency band provided so as to be suitable, for example, for the FM band and the first feedback resistor R1 for self-bias. The second amplifier circuit 4 has a low frequency characteristic and comprises an amplifier A2 for low-frequency band provided so as to be suitable, for example, for the AM band and the second feedback resistor R2 for self-bias. While the amplifier circuits 3 and 4 have in their feedback circuits the first and second switching elements SW1 and SW2 capable of interrupting the outputs of the amplifier circuits 3 and 4, the switching elements SW1 and SW2 may be connected outside the amplifier circuits 3 and 4 as long as they have the function described above.

Figure 2:
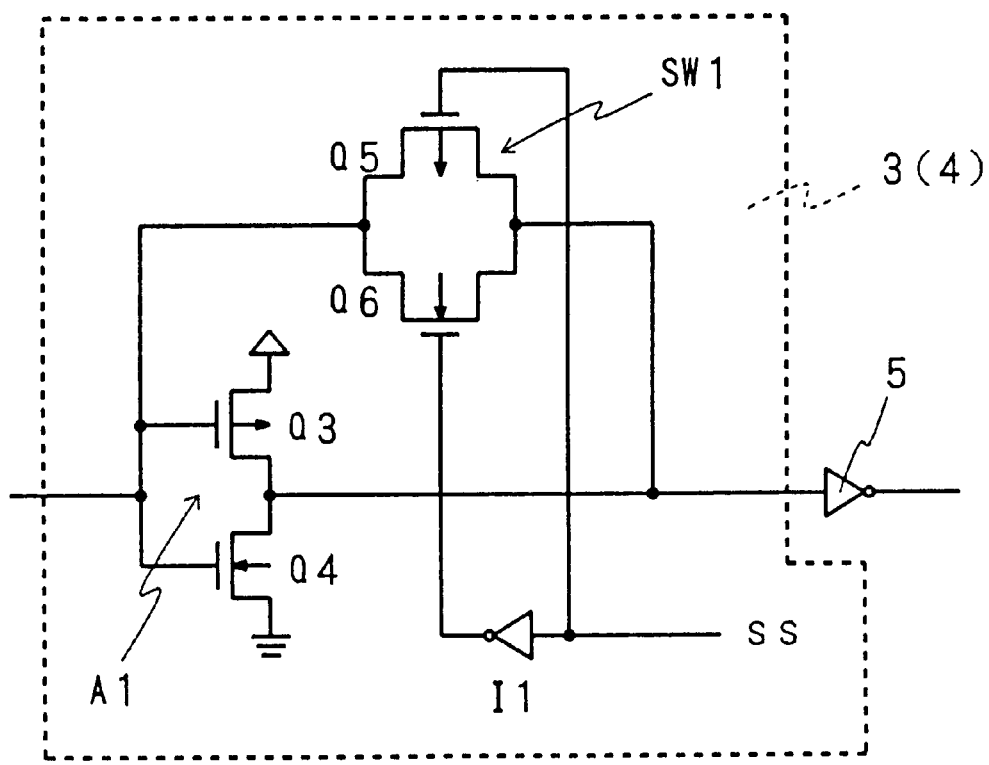
FIG. 2 is a circuit diagram showing an example of a first switching element of FIG. 1.

The switching elements SW1 to SW3 are formed as analog switching circuits comprising transistors such as MOSFETs and are turned on or off for switching between connection and non-connection. An example of the first amplifier circuit 3 comprising an amplifier and a switching element is shown in FIG. 2. In FIG. 2, reference designation A1 represents the first amplifier of FIG. 1 which is formed as a CMOS (complementary metal-oxide-semiconductor) inverter in which transistors Q3 and Q4 comprising a PMOSFET (p-channel MOSFET) and an NMOSFET (n-channel MOSFET), respectively, are connected in series between the supply voltage and the reference voltage. In the switching element SW1, the sources and drains of transistors Q5 and Q6 comprising a PMOSFET and an NMOSFET are connected in parallel and to the gates thereof, a control signal SS is applied directly to one of them and via an inverter element I1 to the other. Consequently, when the control signal SS is applied, the transistors Q5 and Q6 are both turned on or off and when the first switching element SW1 is on, the feedback circuit is closed, so that the self-bias is applied to actuate the amplifier A1. By applying a control signal similar to the control signal SS to the second and third switching elements SW2 and SW3 through the inverter element so that the switching elements SW2 and SW3 are brought to on and off states described later, logical controlling means can be formed for controlling on and off of the switching elements only with the control signal.

Next, an operation of the input circuit of the present invention shown in FIG. 1 will be described.

When the VCO of the front end has one output terminal common to the AM and FM signals, the output terminal is connected to the first input terminal 1 of the circuit of the present invention shown in FIG. 1 and the second input terminal 2 is made open.

When the signal transmitted from the front end is an FM signal, the third switching element SW3 is turned off, the first switching element SW1 is turned on and the second switching element SW2 is turned off. The transistor Q1 (fourth switching element) is turned off and the transistor Q2 (fifth switching element) is turned on. Consequently, the FM signal input to the first input terminal 1 cannot pass through the third switching element SW3 but is transmitted to the first amplifier A1. Since the first switching element SW1 is turned on, a feedback circuit is formed through the feedback resistor R1 and self-bias is applied to cause the first amplifier circuit 3 to act as a linear amplifier having a high frequency characteristic, so that the amplified signal is further transmitted to the amplifier A3 and input to a non-illustrated counter circuit. At this time, on the side of the second amplifier circuit 4, nothing is input to the second input terminal 2 because the second input terminal 2 is pulled down by the turning on of the transistor Q2 and the signal input to the first input terminal 1 is not transmitted because the third switching element SW3 is off. Further, the second switching element SW2 is off. Consequently, the second amplifier circuit 4 is not actuated even if some signal leaks thereinto, so that neither interference nor noise is caused.

When the signal transmitted from the front end is an AM signal, the third switching element SW3 is turned on, the first switching element SW1 is turned off and the second switching element SW2 is turned on. The transistor Q1 (fourth switching element) is turned off and the transistor Q2 (fifth switching element) is also turned off. Consequently, the signal input to the first input terminal 1 is transmitted via the third switching element SW3 to the side of the second amplifier circuit 4 and since the second switching element SW2 is turned on, a feedback circuit is formed through the second feedback resistor R2 and self-bias is applied to cause the second amplifier circuit 4 to act as a linear amplifier having a low frequency characteristic, so that the amplified signal is further transmitted to the amplifier A4 and input to the non-illustrated counter circuit. At this time, on the side of the first amplifier circuit 3, since the first switching element SW1 is turned off, the first amplifier circuit 3 is not actuated because no self-bias is applied thereto. Consequently, even if the AM signal enters the side of the first amplifier circuit 3, the signal cannot be further transmitted from the first amplifier A1, so that it does not occur that an AM signal enters the FM receiver side to cause interference or noise.

The case will be described where the VCO of the front end has two output terminals for the AM and FM signals, respectively. In this case, the two output terminals are connected to the first and second input terminals 1 and 2 of the circuit of the present invention shown in FIG. 1, respectively.

When an FM signal is inputted to the first input terminal 1, as described above, the third and second switching elements SW3 and SW2 are turned off, the first switching element SW1 is turned on, the transistor Q1 is turned off and the transistor Q2 is turned on. The operation is the same as that described above.

When an AM signal is input to the second input terminal 2, the first switching element SW1 is turned off and the second and third switching elements are turned on. The transistors Q1 and Q2 are turned off. Consequently, the AM signal input to the second input terminal 2 is transmitted to the side of the second amplifier circuit 4 and since the second switching element SW2 is on, a feedback circuit is formed and self-bias is applied to cause the second amplifier circuit 4 to act as an linear amplifier having a low frequency characteristic. Then, as described above, the amplified AM signal is transmitted to the side of the non-illustrated counter circuit. On the other hand, the first amplifier circuit 3 is not actuated but is interrupted because the switching element SW1 is off. For this reason, it does not occur that an AM signal enters the receiving circuit on the FM receiving side to cause interference.

By using such controlling means, even if an AM signal is inputted to the input terminal 1, the same controlling means enables the AM signal to be amplified by the second amplifier circuit 4 having a low frequency characteristic (the control can be performed by the same controlling means that is used in the case where the VCO of the front end has one output terminal common to the AM and FM bands and the output terminal is connected to the first input terminal 1). However, control may be performed such that when an AM signal is input to the second input terminal 2, the third and first switching elements SW3 and SW1 are turned off, the second switching element SW2 is turned on, the transistor Q1 is turned on and the transistor Q2 is turned off. In this case, the input from the input terminal 2 is interrupted by the third switching element SW3 and no signal is input to the input terminal 1; even if noise is input thereto, the input terminal 1 is pulled down because the transistor Q1 is on, so that nothing is inputted to the side of the first amplifier circuit 3, thereby preventing the interference with the FM receiving side.

The above-mentioned control of on and off of the first to third switching elements SW1 to SW3 and the transistors Q1 and Q2 (fourth and fifth switching elements) is performed, as described above, by the controlling means for synchronizing with the control signal SS the input signal to the gate of an analog switching circuit comprising an NMOSFET, a PMOSFET and an inverter element as shown in FIG. 2.

While the above-described example is for the output signal of the VCO, the present invention is not limited thereto. Since the frequencies of the intermediate-frequency signals which are 10.7 MHz and 450 kHz greatly differ from each other, it is preferable to provide different amplifier circuits for the high-frequency band and for the low-frequency band and in that case, the input circuit of the present invention may be used. Moreover, the present invention is not limited to the AM/FM radio receiver. The input circuit of the present invention may be used for a frequency synthesizer IC which amplifies signals of frequency bands away from each other with a MOSFET.

While in the above-described example, the first and second switching elements SW1 and SW2 and the first and second feedback resistors R1 and R2 are separately provided, the first and/or the second switching elements may be used also as the first and/or the second feedback resistors by using the resistors of the switching elements as feedback resistors.

According to the present invention, since the signal transmission is controlled by a combination of the switching element inserted between the input terminals and the switching elements capable of interrupting the outputs of the amplifier circuits, both of the cases may be handled where signals of the high-frequency band and the low-frequency band are output from one output terminal and where the signals are output from two output terminals. Consequently, irrespective of the output format of the front end of the radio receiver, the input circuit of the present invention may be connected to the succeeding circuit as it is without the need for changing the synthesizer IC having a PLL circuit or for adding another part and with hardly any concern for the attenuation of the input level or the interference.

Figure 3:
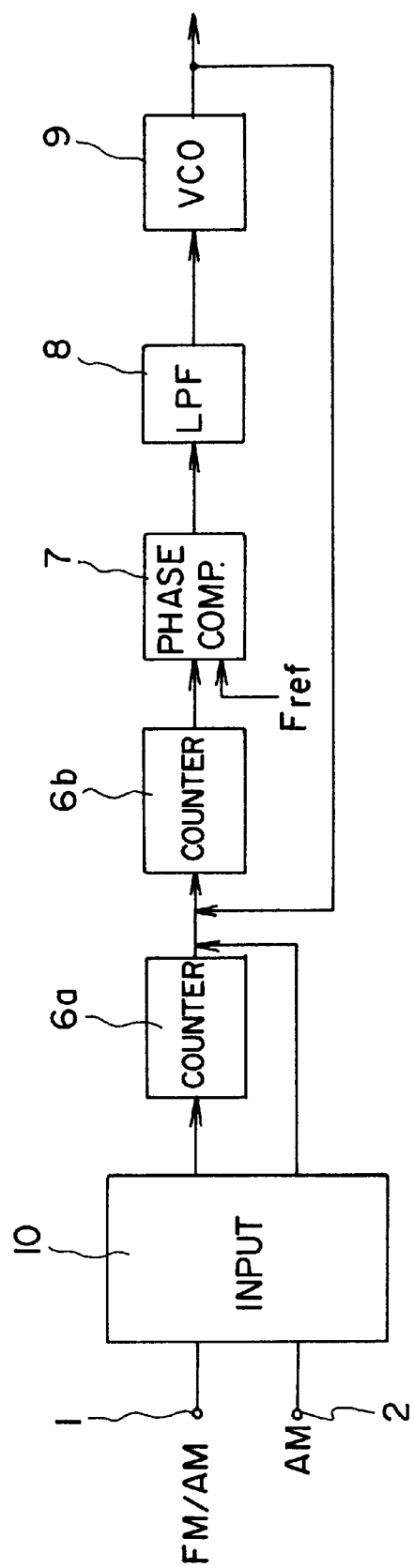
FIG. 3 is a block diagram showing an example of an integrated circuit for a PLL frequency synthesizer in which a PLL circuit is connected to the input circuit of FIG. 1.
Figure 4:
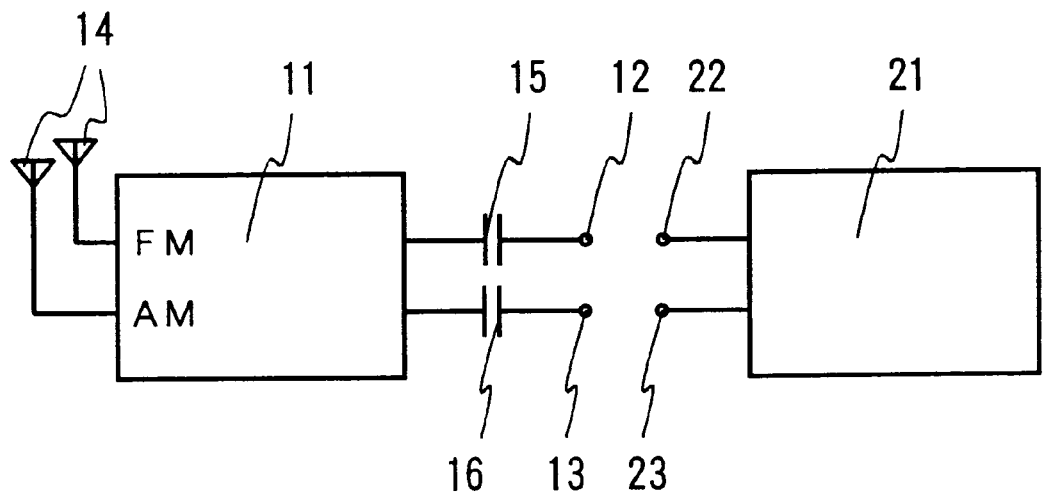
FIGS. 4(a) to 4(b) show examples of conventional connection between a front end and a PLL circuit.
Figure 4:
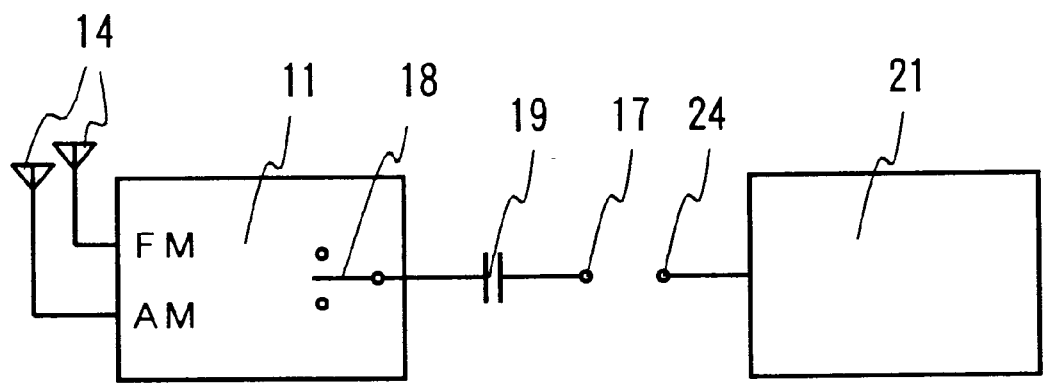
Figure 5:
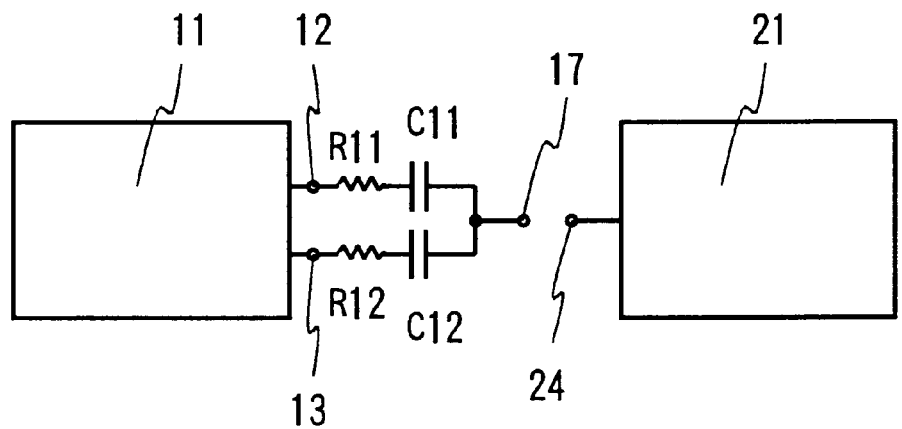
FIGS. 5(a) to 5(b) show examples in which the number of output terminals of a front end is adjusted according to the number of input terminals of the PLL circuit in the conventional connection between the front end and the PLL circuit.
Figure 5:
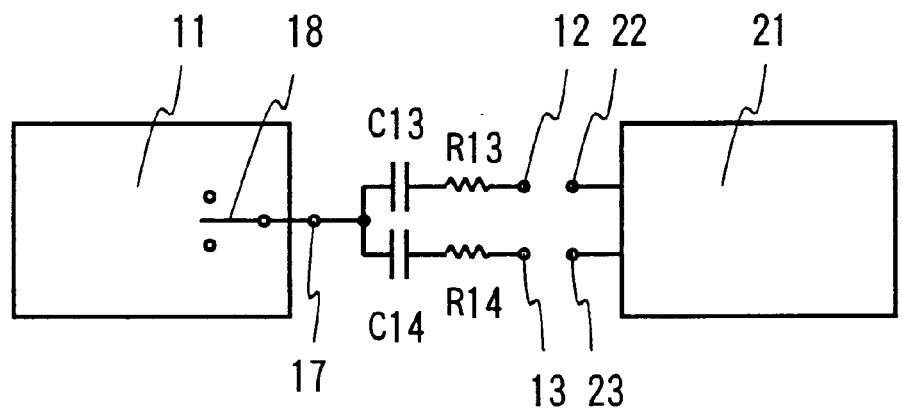

An example of a PLL circuit for a frequency synthesizer in which the input circuit shown in FIG. 1 is provided in the input section is shown in FIG. 3. The PLL circuit comprises the input circuit 10 of FIG. 1 having the first and second input terminals 1 and 2, counter circuits 6a and 6b for dividing the signal frequency, a phase comparator 7, a LPF (low-pass filter) 8 and a VCO 9. The counter circuit comprises a swallow counter 6a of, for example, 4 bits and a programmable divider 6b of, for example, 12 bits. To the output terminal for the high-frequency band (FM band) of the input circuit 10, the first and second counter circuits 6a and 6b are connected for frequency-dividing the output. The output terminal for the low-frequency band (AM band) of the input circuit 10 is directly input to the second counter circuit 6b for frequency-dividing the output. The frequency-divided output is input to the phase comparator 7 together with a reference clock signal $F_{ref}$. At the phase comparator 7, a voltage is generated which corresponds to the difference in frequency or phase between two input signals. The output is converted into a direct current voltage through the LPF 8 which removes higher harmonic components generated at the phase comparator 7 and changes the output frequency of the VCO 9. This operation is repeated to tune the FM/AM signals to a predetermined reference signal.

Although preferred embodiments have been described in some detail, it is to be understood that certain changes can be made by those skilled in the art without departing from the spirit and scope of the invention as defined by the appended claims.

What is claimed is:

1. An input circuit of a counter circuit, comprising:

first and second input terminals;

first and second amplifier circuits connected to said first and second input terminals, respectively, said second amplifier circuit having a lower frequency characteristic than said first amplifier circuit;

first and second feedback resistors for self-bias incorporated in said first and second amplifier circuits, respectively;

first and second switching elements incorporated in at least one of a) the first and second amplifier circuits, respectively, and b) externally connected, said first and second switching elements for interrupting outputs from said amplifier circuits to inputs of said amplifier circuits;

a third switching element connected between said first and second input terminals; and means for controlling on and off of said switching elements such that based upon a signal input to said first and second input terminals, said signal is transmitted to one of a) said first amplifier circuit and b) said second amplifier circuit.

2. An input circuit of a counter circuit according to claim 1, wherein a) when a plurality of signals having different frequencies are all input to the first input terminal, said controlling means is set so that when the third switching element is off, the first switching element is on and the second switching element is off and when the third switching element is on, the first switching element is off and the second switching element is on, and b) when signals are separately input to said first and second input terminals, said controlling means is set so that when a signal input to the first input terminal is processed, the second switching element is off and the first switching element is on and when a signal input to the second input terminal is processed, the first switching element is off and the second switching element is on.

3. An input circuit according to claim 1, wherein at least one of said first and second switching elements is used also as one of said first and second feedback resistors by using resistors of a respective switching element.

4. An input circuit according to claim 1, wherein at least one of fourth and fifth switching elements are connected between at least one of said first and second input terminals and ground, and wherein means for turning on said fourth and fifth switching elements when no signal is input to said input terminals and said amplifier circuits to which said switching elements are connected is provided in said controlling means.

5. An integrated circuit for a frequency synthesizer, comprising:

(a) an input circuit of a counter circuit comprising: first and second input terminals; first and second amplifier circuits connected to said first and second input terminals, respectively, said second amplifier circuit having a lower frequency characteristic than said first amplifier circuit; first and second feedback resistors for self-bias incorporated in said first and second amplifier circuits, respectively; first and second switching elements incorporated in at least one of a) the first and second amplifier circuits, respectively, and b) externally connected, said first and second switching elements being capable of interrupting feedback outputs of said amplifier circuits; and a third switching element connected between said first and second input terminals, wherein means for controlling on and off of said switching elements is provided in order that according to a signal input to said first and second input terminals, the signal is transmitted to one of the first amplifier circuit and the second amplifier circuit;

(b) a counter circuit for frequency-dividing one of a high-frequency signal and a low-frequency signal output from said input circuit; and (c) a phase comparator for comparing one of a wavelength and a phase of an output of said counter circuit with that of a reference signal.

6. An integrated circuit according to claim 5, wherein a low-pass filter and a voltage-controlled oscillator are connected at an output of said phase comparator, and an output of said voltage-controlled oscillator is fed back to said phase comparator to perform frequency tuning.

7. An integrated circuit according to claim 5, wherein said first and/or second switching elements are used also as said first and/or second feedback resistors by using resistors of said first and/or second switching elements.

8. An integrated circuit according to claim 6, wherein said first and/or second switching elements are used also as said first and/or second feedback resistors by using resistors of said first and/or second switching elements.

* * * * *